US012126338B1

(12) United States Patent
Bien et al.

(10) Patent No.: US 12,126,338 B1
(45) Date of Patent: Oct. 22, 2024

(54) SWITCH WITH CASCODE ARRANGEMENT

(71) Applicant: NXP USA, Inc., Austin, TX (US)

(72) Inventors: David Edward Bien, Glendale, AZ (US); Xu Jason Ma, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 42 days.

(21) Appl. No.: 18/295,498

(22) Filed: Apr. 4, 2023

(51) Int. Cl.
*H03K 19/018* (2006.01)
*H03K 17/10* (2006.01)
*H03K 17/687* (2006.01)
*H03K 19/0185* (2006.01)

(52) U.S. Cl.
CPC ... *H03K 19/018528* (2013.01); *H03K 17/102* (2013.01); *H03K 17/6872* (2013.01)

(58) Field of Classification Search
None
See application file for complete search history.

(56) References Cited

U.S. PATENT DOCUMENTS

| | | | | |
|---|---|---|---|---|
| 5,406,225 A * | 4/1995 | Iida | ........................ | H03F 1/301 330/296 |
| 5,995,010 A * | 11/1999 | Blake | .............. | H03K 3/356113 340/653 |
| 6,462,527 B1 * | 10/2002 | Maneatis | ................... | H03L 7/18 323/315 |
| 6,573,752 B1 * | 6/2003 | Killat | .............. | H03K 19/003 15 327/309 |
| 7,145,370 B2 | 12/2006 | Bernard et al. | | |
| 7,236,410 B2 * | 6/2007 | Schrom | ................... | G11C 17/18 365/189.11 |
| 7,429,873 B2 | 9/2008 | Peschke | | |
| 9,979,352 B2 * | 5/2018 | Hur | ....................... | H03F 1/0288 |

(Continued)

FOREIGN PATENT DOCUMENTS

CN 111030608 A 4/2020
CN 210693865 U 6/2020

OTHER PUBLICATIONS

U.S. Appl. No. 18/183,006, not yet published; 37 pages (Mar. 13, 2023).

(Continued)

*Primary Examiner* — Thomas J. Hiltunen
(74) *Attorney, Agent, or Firm* — Andrew C. Milhollin

(57) ABSTRACT

A switching device may include an input terminal, an output terminal, a primary switching transistor coupled between the input terminal and the output terminal, logic circuitry configured to receive a control signal to selectively activate the switching device, a first cascode arrangement coupled between the logic circuitry and a first reference voltage supply, and a second cascode arrangement coupled between the input terminal and the primary switching transistor. The first cascode arrangement may include cascode transistors having gate terminals coupled to a first voltage divider coupled between the first reference voltage supply and a second reference voltage supply that is coupled to the logic circuitry. The second cascode arrangement may include a first cascode transistor coupled to a fixed voltage at the first voltage divider and second and third cascode transistors coupled to variable cascode bias voltages at a second voltage divider coupled to a variable voltage input.

19 Claims, 3 Drawing Sheets

(56) References Cited

U.S. PATENT DOCUMENTS

| | | |
|---|---|---|
| 11,223,358 B2 * | 1/2022 | Sanchez ......... H03K 19/018585 |
| 2015/0270806 A1 | 9/2015 | Wagh et al. |
| 2017/0047909 A1 | 2/2017 | Rana et al. |
| 2019/0158027 A1 | 5/2019 | Williams |
| 2021/0175859 A1 | 6/2021 | Brantley et al. |
| 2024/0146305 A1 * | 5/2024 | Yu .......................... H03K 19/20 |

OTHER PUBLICATIONS

Non-Final Office Action; U.S. Appl. No. 18/183,006; 9 pages (Jul. 2, 2024).

Kagan Kaya: "Meeting Biasing Requirements of Externally Biased RF/Microwave Amplifiers with Active Bias Controllers", Analog Devices AN-1363 Application Note, 2016-2018, Rev A, 16 pages.

Mandegaran, Sam et al; "A Breakdown Voltage Multiplier for High Voltage Swing Drivers"; IEEE J. of Solid-State Circuits, vol. 42, No. 2; 11 pages (Feb. 2007).

Pashmineh, Sara et al; "A High-Voltage Driver Based on Stacked Low-Voltage Transistors with Minimized On-Resistance for a Buck Converter in 65 nm CMOS"; IEEE Canadian Conference on Electrical and Computer Engineering; 5 pages (2016).

Pashmineh, Sara et al; "Design of high speed high-voltage drivers based on stacked standard CMOS for various supply voltages"; Int'l Midwest Symposium on Circuits and Systems; 4 pages (2013).

* cited by examiner

SWITCH WITH CASCODE ARRANGEMENT

TECHNICAL FIELD

Embodiments of the subject matter described herein relate generally to switching devices, including switching devices with one or more cascode stages.

BACKGROUND

Semiconductor devices find application in a wide variety of electronic components and systems. For example, semiconductor transistor-based switching devices are commonly used to selectively provide low resistance paths between two nodes. Transistors used to implement such switching devices typically have defined voltage limits. If such voltage limits are exceeded, the corresponding transistor may be damaged, which may negatively impact the operability of the corresponding switching device.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a switch may include a first input terminal, a second input terminal, logic circuitry configured to receive a control signal, a first voltage divider that includes first series resistances, where the first voltage divider is electrically coupled between first reference voltage supply and a second reference voltage supply, a second voltage divider that includes second series resistances, where the second voltage divider is electrically coupled between the second input terminal and the first reference voltage supply, a first cascode arrangement electrically coupled to the logic circuitry and including at least one set of series-connected transistors having control terminals electrically coupled to nodes of the first voltage divider, a primary switching transistor that includes a first current-carrying terminal, a second current-carrying terminal electrically coupled to the first current-carrying terminal and electrically coupled to the first reference voltage supply, and a first control terminal configured to control the flow of current from the first current-carrying terminal to the second current-carrying terminal, where the first control terminal is electrically coupled to the first cascode arrangement, and the logic circuitry is configured to control a state of the primary switching transistor based on the control signal, and a second cascode arrangement. The second cascode arrangement may include a first cascode transistor that includes a third current-carrying terminal electrically coupled to the input terminal, a fourth current-carrying terminal electrically coupled to the third current-carrying terminal, and a second control terminal configured to control the flow of current from the third current-carrying terminal to the fourth current-carrying terminal, where the second control terminal is electrically coupled to the second voltage divider, a second cascode transistor that includes a fifth current-carrying terminal electrically coupled to the fourth current-carrying terminal of the first cascode transistor, a sixth current-carrying terminal electrically coupled to the fifth current-carrying terminal, and a third control terminal configured to control the flow of current from the fifth current-carrying terminal to the sixth current-carrying terminal, where the third control terminal is electrically coupled to the second voltage divider, and a third cascode transistor that includes a seventh current-carrying terminal electrically coupled to the sixth current-carrying terminal of the second cascode transistor, an eighth current-carrying terminal electrically coupled to the seventh current-carrying terminal, and a fourth control terminal configured to control the flow of current from the seventh current-carrying terminal to the eighth current-carrying terminal, where the fourth control terminal is electrically coupled to the first voltage divider.

In one or more embodiments, the switch may include a pair of cross-coupled transistors electrically coupled between the first cascode arrangement and the first reference voltage supply. The pair of cross-coupled transistors may include a first cross-coupled transistor having a ninth current-carrying terminal electrically coupled to the first cascode arrangement, a tenth current-carrying terminal electrically coupled to the ninth current-carrying terminal and to the first reference voltage supply, and a fifth control terminal configured to control the flow of current from the ninth current-carrying terminal to the tenth current-carrying terminal, and a second cross-coupled transistor having an eleventh current-carrying terminal electrically coupled to the first cascode arrangement, a twelfth current-carrying terminal electrically coupled to the eleventh current-carrying terminal and to the first reference voltage supply, and a sixth control terminal configured to control the flow of current from the eleventh current-carrying terminal to the twelfth current-carrying terminal, where the sixth control terminal is electrically coupled to the ninth current-carrying terminal, and the eleventh current-carrying terminal is electrically coupled to the fifth control terminal and the first control terminal.

In one or more embodiments, the switch may include a voltage divider enable transistor having a thirteenth current-carrying terminal electrically coupled to second voltage divider, a fourteenth current-carrying terminal electrically coupled to the thirteenth current-carrying terminal and to the first reference voltage supply, and a seventh control terminal configured to control the flow of current from the thirteenth current-carrying terminal to the fourteenth current-carrying terminal, where the seventh control terminal is electrically coupled to the ninth current-carrying terminal of the first cross-coupled transistor.

In one or more embodiments, the switch may include series-connected transistors electrically coupled between the second voltage divider and the first reference voltage supply, each of the series-connected transistors having a respective control terminal and a respective current-carrying terminal electrically coupled to its respective control terminal, and a clamping transistor having a fifteenth current-carrying terminal electrically coupled to the series-connected transistors, a sixteenth current-carrying terminal electrically coupled to the fifteenth current-carrying terminal and to the first reference voltage supply, and a eighth control terminal configured to control the flow of current from the fifteenth current-carrying terminal to the sixteenth current-carrying terminal, where the eighth control terminal is electrically coupled to the eleventh current-carrying terminal of the second cross-coupled transistor.

In one or more embodiments, the second input terminal is configured to receive a variable voltage, and voltages at nodes of the second voltage divider are dependent on the variable voltage when the primary switching transistor is in an open state.

In one or more embodiments, the clamping transistor and the series-connected transistors are configured to set the voltages at the nodes of the second voltage divider to a fixed voltage when the primary switching transistor is in a closed state.

In one or more embodiments, the fourth control terminal of the third cascode transistor is configured to receive a fixed voltage from the first voltage divider.

In one or more embodiments, the logic circuitry is electrically coupled between a positive voltage supply that is configured to output a positive voltage, where the first reference voltage supply is configured to output a first reference voltage that is at least 8 V lower than the positive voltage.

In an example embodiment, a switching device may include a first input terminal, a second input terminal, a first voltage divider electrically coupled between a first reference voltage supply configured to provide a first reference voltage and a second reference voltage supply configured to provide a second reference voltage, logic circuitry coupled to the second reference voltage supply and configured to receive a control signal, a voltage level shifter coupled between the logic circuitry and the first reference voltage supply, a primary switching transistor having a first source terminal electrically coupled to the first reference voltage supply, a first drain terminal, and a first gate terminal electrically coupled to the voltage level shifter, a cascode arrangement electrically coupled between the first drain terminal of the primary switching transistor and the first input terminal, where the cascode arrangement is configured to prevent a drain-source voltage of the primary switching transistor from exceeding a drain-source voltage limit of the primary switching transistor when the switching device is closed, a second voltage divider coupled to the second input terminal, where each of the first voltage divider and the second voltage divider is configured to provide at least one cascode bias voltage to the cascode arrangement.

In one or more embodiments, the cascode arrangement includes a first cascode transistor having a second drain terminal electrically coupled to the input terminal, a second source terminal, and a second gate terminal electrically coupled to a first node of the second voltage divider, a second cascode transistor having a third drain terminal electrically coupled to the second source terminal of the first cascode transistor, a third source terminal, and a third gate terminal electrically coupled to a second node of the second voltage divider, and a third cascode transistor that includes a fourth drain terminal electrically coupled to the third source terminal of the second cascode transistor, a fourth source terminal electrically coupled to the first drain terminal of the primary switching transistor, and a fourth gate terminal electrically coupled to a node of the first voltage divider.

In one or more embodiments, the switching device includes series-connected transistors electrically coupled between the first node of the second voltage divider and the first reference voltage supply, each of the series-connected transistors having a respective gate terminal and a respective drain terminal electrically coupled to its respective gate terminal, and a clamping transistor having a fifth drain terminal electrically coupled to the series-connected transistors, a fifth source terminal electrically coupled to the first reference voltage supply, and a fifth gate terminal electrically coupled to a first node of the voltage level shifter.

In one or more embodiments, the switching device includes a voltage divider enable transistor having a sixth drain terminal electrically coupled to the second voltage divider, a sixth source terminal electrically coupled to the first reference voltage supply, and a sixth gate terminal electrically coupled to a second node of the voltage level shifter.

In one or more embodiments, the second input terminal is configured to receive a variable voltage, and bias voltages at the first node and the second node of the second voltage divider are dependent on the variable voltage when the primary switching transistor is in an open state.

In one or more embodiments, the clamping transistor and the series-connected transistors are configured to set the bias voltages at the first node and the second node of the second voltage divider to a fixed voltage when the primary switching transistor is in a closed state.

In one or more embodiments, the node of the first voltage divider is configured to provide a fixed bias voltage to the fourth gate terminal of the third cascode transistor.

In one or more embodiments, the voltage level shifter includes an additional cascode arrangement electrically coupled to the logic circuitry and to the first voltage divider, and a pair of cross-coupled transistors electrically coupled between the additional cascode arrangement and the first reference voltage supply, where the first node of the voltage level shifter corresponds to a seventh drain terminal of the pair of cross-coupled transistors and the second node of the voltage level shifter corresponds to an eighth drain terminal of the pair of cross-coupled transistors.

In one or more embodiments, the additional cascode arrangement includes a first set of series-coupled transistors electrically coupled between the logic circuitry and seventh drain terminal of the pair of cross-coupled transistors and having first gate terminals electrically coupled to the first voltage divider, and a second set of series-coupled transistors electrically coupled between the logic circuitry and eighth drain terminal of the pair of cross-coupled transistors and having second gate terminals electrically coupled to the first voltage divider.

In one or more embodiments, the logic circuitry and the voltage level shifter are configured to control a state of the primary switching transistor based on the control signal.

In one or more embodiments, the first reference voltage is at least 8 V lower than the second reference voltage.

In an example embodiment, control circuitry includes an amplifier transistor configured to receive an RF input signal for amplification, a reference transistor, where the amplifier transistor and the reference transistor are formed on the same semiconductor die, a unity gain buffer having a non-inverting input electrically coupled to the reference transistor, an output electrically coupled to a control terminal of the amplifier transistor, and an inverting input electrically coupled to the output of the unity gain buffer, and a switch. The switch may include a first input terminal, a second input terminal, a first voltage divider electrically coupled between a first reference voltage supply configured to provide a first reference voltage and a second reference voltage supply configured to provide a second reference voltage, logic circuitry coupled to the second reference voltage supply and configured to receive a control signal, a voltage level shifter coupled between the logic circuitry and the first reference voltage supply, a primary switching transistor having a first source terminal electrically coupled to the first reference voltage supply, a first drain terminal, and a first gate terminal electrically coupled to the voltage level shifter, a cascode arrangement electrically coupled between the first drain terminal of the primary switching transistor and the first input terminal, where the cascode arrangement is configured to prevent a drain-source voltage of the primary switching transistor from exceeding a drain-source voltage limit of the primary switching transistor when the switch is closed, and a second voltage divider coupled to the second input terminal, where each of the first voltage divider and the second voltage divider is configured to provide at least one cascode bias voltage to the cascode arrangement.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
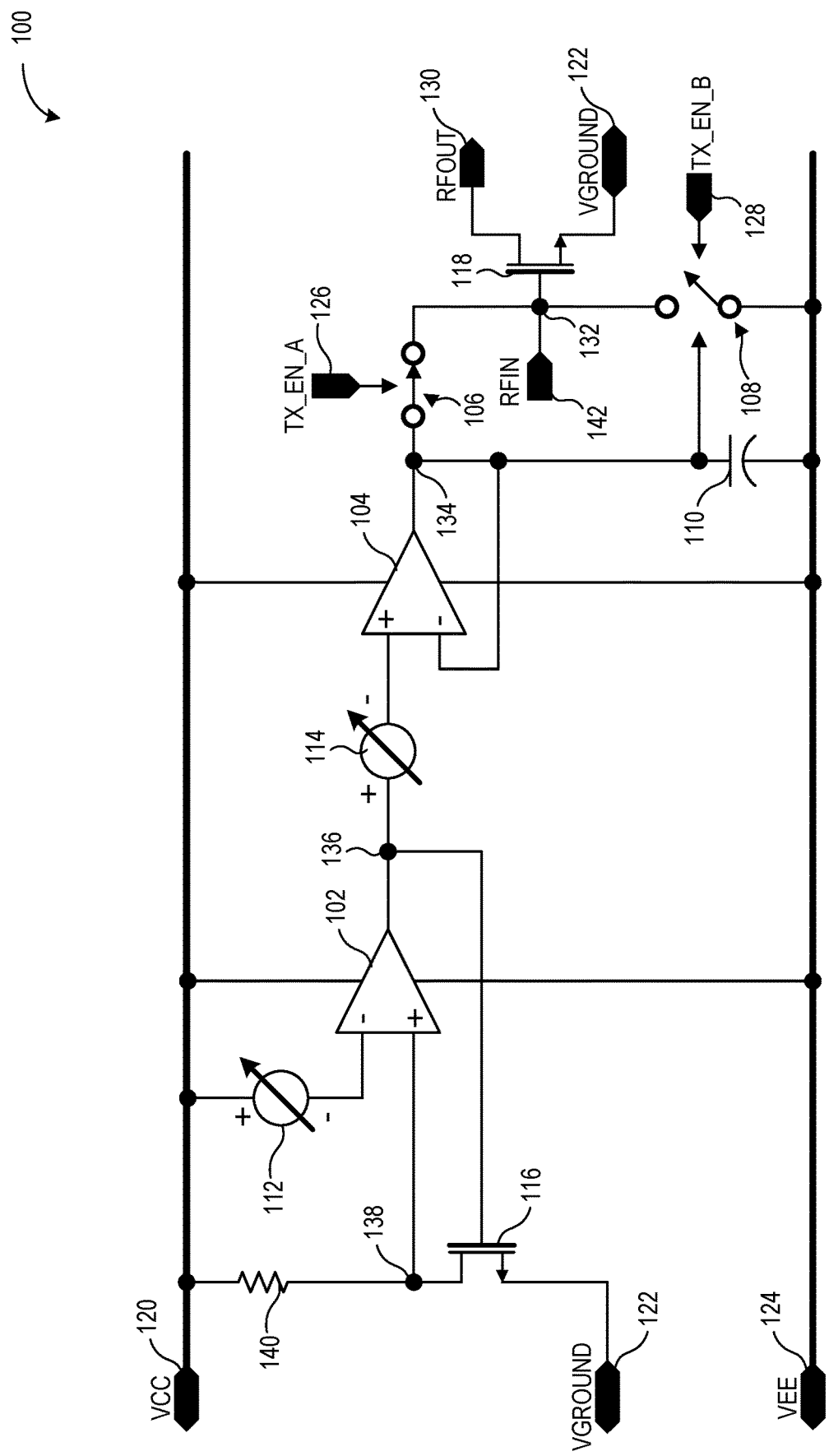
FIG. 1 is a block diagram of example transistor gate control circuitry, in accordance with various embodiments.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted for sake of brevity. Additionally, elements in the drawing figures are not necessarily drawn to scale. For example, the dimensions of some of the elements or regions in the figures may be exaggerated relative to other elements or regions to help improve understanding of embodiments described herein.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Various embodiments described herein relate to a semiconductor transistor-based switching device (i.e., "switch") that includes at least one cascode arrangement configured to prevent or mitigate conditions in which one or more voltage limits of one or more transistors of the switch are exceeded. In one or more embodiments, the switch may be configured to selectively couple a switch input terminal to a voltage supply (e.g., a negative voltage supply, a reference voltage supply, or another suitable voltage supply). For a given switch, if the voltage difference between any two of an input terminal of the switch, an output terminal of the switch (a voltage supply, in the present example), and a control terminal of the switch exceeds the voltage limits of one or more transistors of the switch, such transistors could be damaged. To address this problem, in one or more embodiments, a switch includes a first cascode arrangement and a second cascode arrangement, each including respective sets of series-connected transistors (i.e., transistors that are coupled together source-to-drain along a single path), where the first cascode arrangement is coupled between logic circuitry (e.g., with voltages at around 0 V or around 1.8 V) and a reference voltage supply configured to supply a comparatively lower voltage (e.g., around −8 V), and the second cascode arrangement is coupled between the input terminal (e.g., configured to receive input voltages in a range of between around 0 V and around −8 V) of the switch and the reference voltage supply.

In the first cascode arrangement, a first set of series-connected transistors is coupled between logic circuitry used to control the state of the switch and a first cross-coupled transistor of a pair of cross-coupled transistors, a second set of series-connected transistors is coupled between the logic circuitry and a second cross-coupled transistor of the pair of cross-coupled transistors. Each transistor of the first set of series-connected transistors may be include a gate terminal that is coupled to a gate terminal of a corresponding transistor of the second set of series-connected transistors, and vice-versa. Gate terminals of the transistors of the first and second sets of transistors may be respectively coupled to corresponding nodes of a first voltage divider (e.g., a first cascode bias control node having a first cascode bias voltage VCASC1, a second cascode bias control node having a second cascode bias voltage VCASC2, and a third cascode bias control node having a third cascode bias voltage VCASC3). The voltage at the drain terminal of a second cross-coupled transistor of the pair of cross-coupled transistors may be coupled to the gate terminal of the primary switching transistor, and thereby controls whether the primary switching transistor is in an open state or a closed state (i.e., is "off" or "on"). The first voltage divider may include a first set of series-connected resistances coupled between a first reference voltage supply configured to supply a first reference voltage VGND (e.g., around −8 V) and a second reference voltage supply configured to supply a second reference voltage VRTGND (e.g., around 0 V). In one or more embodiments, VRTGND is around 8 V higher than VGND. Each transistor of the first set of series-connected transistors and the second set of series-connected transistor may include a respective ground terminal that is coupled to a corresponding node of the first voltage divider.

The first voltage divider and the first and second sets of series-connected transistors of the first cascode arrangement may be configured such that the Vgs, Vgd, and Vds values across any given transistor of the first and second sets of series-connected transistors and the pair of cross-coupled transistors do not exceed the corresponding Vgs, Vgd, and Vds limits (e.g., around 3 V) of that transistor. By configuring the first cascode arrangement in this way, control signals in a higher voltage domain than the voltage domain of the chip ground (e.g., VGND; where the higher voltage domain is higher than VGND by around 8 V) may be used to control the switch (e.g., at the logic circuitry) without increased risk of damaging transistors of the switch due to the voltage limits of those transistors being exceeded.

In the second cascode arrangement, a third set of series-connected transistors is coupled between the switch input terminal and the primary switching transistor. The third set of series-connected transistors may include a first cascode transistor, a second cascode transistor, and a third cascode transistor, where the first and second transistors are coupled between the switch input terminal and the third transistor, and the third transistor is coupled between the second transistor and the primary switching transistor. Gate terminals of the first and second transistors of the third set of series-connected transistors may be coupled to respective nodes of a second voltage divider (e.g., a fourth cascode bias control node having a fourth cascode bias voltage VCASC4, and a fifth cascode bias control node having a fifth cascode bias voltage VCASC5) and may be configured to receive variable cascode bias voltages from those nodes. For example, the second voltage divider may include a second set of series-connected resistances coupled between a variable voltage input node configured to receive a variable input voltage VBUFF and the first reference voltage supply. The variable cascode bias voltages (e.g., VCASC4, VCASC5) at the nodes of the second voltage divider may change according to the value of the variable input voltage VBUFF. In one or more embodiments, the variable input voltage VBUFF may correspond to the value of the switch input voltage SW_IN received at the switch input terminal when the switch is deactivated. A gate terminal of the third transistor of the third set of series-connected transistors may be coupled to a node (e.g., the first cascode bias control node) of the first voltage divider and may be configured to receive a fixed cascode bias voltage (e.g., VCASC1) from that node.

The first voltage divider, the second voltage divider, and the third set of series-connected transistors of the first cascode arrangement may be configured such that the Vgs, Vgd, and Vds values across any given transistor of the third set of series-connected transistors and the primary switching transistor do not exceed the corresponding Vgs, Vgd, and Vds limits (e.g., around 3 V) of that transistor. By configuring the second cascode arrangement in this way, the range of switch input voltages (i.e., relative to the first reference voltage VGND) that the switch is capable of handling may be increased without increased risk of damaging transistors of the switch due to the voltage limits of those transistors being exceeded.

It should be understood that more or fewer cascode stages than those shown in the first and second cascode arrangements of the following examples may be included to accommodate higher or lower voltage differentials between the switch input terminal and the first reference voltage supply.

In one or more embodiments, the switch may further include a voltage divider enable transistor, a clamping transistor, and a fourth set of series-connected transistors. When the switch is open, the voltage divider enable transistor may configured to couple the second voltage divider to the first reference voltage supply, such that the fourth cascode bias voltage VCASC4 at the fourth cascode stage control node of the second voltage divider and the fifth cascode bias voltage VCASC5 at the fifth cascode stage control node of the second voltage divider each depend on VBUFF. In this way, the voltage divider enable transistor may be configured to prevent Vgs limits of the first cascode transistor and the second cascode transistor from being exceeded when the switch is open.

When the switch is closed, the clamping transistor may be configured to couple the first cascode control node of the second voltage divider to the first reference voltage supply via the fourth set of series-connected transistors, such that the fourth cascode bias voltage VCASC4 at the fourth cascode stage control node of the second voltage divider and the fifth cascode bias voltage VCASC5 at the fifth cascode stage control node of the second voltage divider are each at respective fixed voltages (e.g., each around 2.4 V above VGND). In this way, the clamping transistor may prevent the Vgs limits of the first cascode transistor and the second cascode transistor from being exceeded when the switch is closed.

FIG. 1 is a block diagram of control circuitry 100 that is configured to selectively provide a direct current (DC) bias to a gate terminal of an amplifier transistor 118. As shown, the control circuitry 100 may include a sense amplifier 102, a buffer 104, a first switch 106, a second switch 108, a capacitor 110, a first digital-to-analog convertor (DAC) 112, a second DAC 114, and a sense resistor 140. The control circuitry 100 may be configured to control a reference transistor 116 and the amplifier transistor 118. For example, the control circuitry 100 may be configured as bias circuitry that selectively provides a direct current (DC) bias voltage to the gate of the amplifier transistor 118 based, at least in part, on a voltage detected by the sense amplifier 102 at a drain terminal of the reference transistor 116. As will be described, various elements of the control circuitry 100 may be coupled to one or more of a positive voltage supply 120 configured to supply a positive voltage VCC, a negative voltage supply 124 configured to supply a negative voltage VEE, one or more ground nodes 122 configured to provide reference potential VGND, a first control signal source 126 configured to supply a variable control signal TX_EN_A, or a second control signal source 128 configured to supply a variable control signal TX_EN_B. It should be understood that "ground nodes" herein may not necessarily correspond to "earth ground" but may instead correspond to "signal ground" or another suitable reference potential, in accordance with various embodiments. Herein, the "gate terminal" of a transistor may sometimes be referred to as a "control terminal", and the "drain terminal" and "source terminal" or "emitter terminal" and "collector terminal" of a transistor may sometimes be referred to as "current-carrying terminals."

The sense amplifier 102 may be an operational amplifier having a positive supply terminal coupled directly to the positive voltage supply 120, a negative supply terminal coupled directly to the negative voltage supply 124, an inverting input coupled to an output of the first DAC 112, a non-inverting input coupled to a node 138 disposed between the sense resistor 140 and the drain of the reference transistor 116, and an output coupled to a node 136 that is coupled to an input of the second DAC 114 and the gate of the reference transistor 116. In or more embodiments, the voltage VCC supplied by the positive voltage supply 120 may be around 10 V. In one or more embodiments, the voltage VEE supplied by the negative voltage supply 124 may be around −8 V.

The buffer 104 may be an operational amplifier that is configured as a unity gain buffer. That is, the buffer 104 may be configured such that the voltage at the non-inverting input of the buffer 104 may be equal to the voltage at the output of the buffer 104. The buffer 104 may include a positive supply terminal coupled directly to the positive voltage supply 120, a negative supply terminal coupled directly to the negative voltage supply 124, a non-inverting input coupled to the output of the second DAC 114, an output coupled to a node 134, and an inverting input coupled to the output of the buffer 104 via the node 134.

The first DAC 112 may include an input terminal coupled to the positive voltage supply 120, an output terminal coupled to the inverting input of the sense amplifier 102, and a control input at which first digital control signals are received, where the first digital control signals determine the voltage output by the first DAC 112 relative to the voltage VCC received from the positive voltage supply 120. For example, the voltage output by the first DAC 112 may be between equal to the positive supply voltage VCC minus around 0.2 V and around 1 V (depending on the values of the first digital control signals). Herein, an example amount that is said to be "around" or "approximately" a given value is considered to be within +/−10% of the given value unless otherwise indicated.

The second DAC 114 may include an input terminal coupled to each of the output of the sense amplifier 102 and the gate of the reference transistor 116 via the node 136, an output terminal coupled to a non-inverting input of the buffer 104, and a control input at which second digital control signals are received, where the second digital control signals determine the voltage output by the second DAC 114 relative to the voltage at the node 136 (i.e., the voltage at the output of the sense amplifier 102). For example, given a voltage of around −3 V to around −1.5 V output by the sense amplifier 102, the voltage output by the second DAC 114 may be in a range of around −6.5 V to around −1 V or in a range of around −8 V to around 0 V (depending, at least in part, on the values of the second digital control signals).

The capacitor 110 may be coupled between the node 134 and the negative voltage supply 124. According to various embodiments, the capacitor 110 may have a capacitance in a range of around 1 nF to around 1 μF. For example, the capacitor 110 may improve the transient response at the node 134. The sense resistor 140 may be coupled between the node 138 and the positive voltage supply 120.

The reference transistor 116 may include a drain terminal coupled to the node 138, a source terminal coupled to the ground node 122, and a gate terminal coupled to the node 136. The amplifier transistor 118 may include a drain terminal coupled to an output 130, a source terminal coupled to the ground node 122, and a gate terminal coupled to the node 132. The first switch 106 may include an input terminal coupled to the node 134, an output terminal coupled to the node 132, and a control terminal coupled to the first control signal source 126 and configured to receive the variable control signal TX_EN_A. The second switch 108 may include an input terminal coupled to the node 132, an output terminal coupled to the negative voltage supply 124, and a control terminal coupled to the second control signal source 128 and configured to receive the variable control signal TX_EN_B. In one or more embodiments, the output of the buffer 104 is also directly coupled to an input terminal (e.g., the variable input terminal 302 of FIG. 2) of the second switch 108 that is separate from the switch input terminal of the second switch 108.

An RF input signal RFIN may be supplied by an RF signal source 142 to the gate of the amplifier transistor 118 via the node 132. The RF input signal RFIN may be amplified by the amplifier transistor 118 to produce an RF output signal RFOUT at the output 130.

The sense amplifier 102 may be configured to compare a first voltage output by the first DAC 112 (e.g., in a range of around 4 V to around 5.2 V) to a second voltage at the node 138 (e.g., in a range of around 8 V to around 9 V), corresponding to the voltage at the drain terminal of the reference transistor 116, then output a third voltage (e.g., in a range of around 2.8 V to around 5 V) based on this comparison, at the node 136. For example, the third voltage output by the sense amplifier 102 may be equal to the difference between the first voltage and the second voltage received by the sense amplifier 102. The second DAC 114 may apply a voltage offset to the third voltage output by the sense amplifier 102 to produce a fourth voltage at its output (e.g., in a range of around −6.5 V to around −1 V or in a range of around −8 V to around 0 V), which the DAC 114 may provide to the non-inverting input of the buffer 104. The buffer 104 may be a unity gain buffer that is configured to output the voltage received at its non-inverting input. That is, the buffer 104 may receive the fourth voltage at its non-inverting input and then output the fourth voltage (e.g., at the node 134).

The output of the buffer 104 may be selectively coupled to the gate of the amplifier transistor 118 via the first switch 106 and a node 132 disposed between the output of the first switch 106 and the gate of the amplifier transistor 118. The first switch 106 may be selectively opened and closed based on the variable control signal TX_EN_A provided to the control terminal of the first switch 106 by the first control signal source 126. The second switch 108 may be selectively opened and closed based on the variable control signal TX_EN_B provided to the control terminal of the second switch 108 by the second control signal source 128. Herein, a switch or transistor is considered to be "closed", "on", or "activated" when a relatively low impedance path is provided between the input terminal of the switch and the output terminal of the switch, permitting electric current to flow between its input terminal and its output terminal. Herein, a switch or transistor is considered to be "open", "off" or "deactivated" when a relatively high impedance path is provided between its input terminal and its output terminal, such that the flow of current is reduced or blocked therebetween.

In one or more embodiments, the first control signal source 126 and the second control signal source 128 may be configured such that the first control signal source 126 only closes the first switch 106 (e.g., by asserting the variable control signal TX_EN_A) after the second control signal source 128 has opened the second switch 108 (e.g., by deasserting the variable control signal TX_EN_B), and such that the second control signal source 128 only closes the second switch 108 (e.g., by asserting the variable control signal TX_EN_B) after the first control signal source 126 has opened the first switch 106 (e.g., by deasserting the variable control signal TX_EN_A). Such configuration of the first control signal source 126 and the second control signal source 128 may prevent the first switch 106 and the second switch 108 from being closed simultaneously and may thereby prevent undesirable shoot-through current through the first switch 106 and the second switch 108. The variable control signals TX_EN_A and TX_EN_B may be at around 1.8 V when asserted and around 0 V when deasserted.

When the first switch 106 is open and the second switch 108 is closed, the gate of the amplifier transistor 118 is coupled to the negative voltage supply 124 and receives the negative voltage VEE (e.g., around −8 V), which causes the amplifier transistor 118 to be open (disabled). When the first switch 106 is closed and the second switch 108 is open, the gate of the amplifier 118 is coupled to the voltage at the output of the buffer 104 (e.g., in a range of around −6.5 V to around −1 V or in a range of around −8 V to around 0 V), which acts as a DC bias at the gate sufficient to activate the amplifier transistor 118 (e.g., when RFIN is also sufficiently high).

In one or more embodiments, the reference transistor 116 and the amplifier transistor 118 may each be formed on the same semiconductor die and in close proximity to one another, such that the reference transistor 116 exhibits process and temperature dependencies that are similar to those of the amplifier transistor 118. As a non-limiting example, the reference transistor 116 and the amplifier transistor 118 may each be Gallium Nitride (GaN) field effect transistors (FETs) formed on the same GaN die or GaN-on-SiC die as non-limiting examples. Process and temperature dependencies exhibited by the reference transistor 116 affect the voltage at the node 138, which causes corresponding changes in the voltage output by the sense amplifier 102, observable at the node 136, which causes corresponding changes in the voltage provided at the gate of the amplifier transistor 118 (i.e., the "DC bias voltage") when the first switch 106 is closed. In this way, process and temperature dependencies of the amplifier transistor 118 may be accounted for by dynamically adjusting the bias voltage supplied to the gate of the amplifier transistor 118 based on the similar process and temperature dependencies of the reference transistor 116.

In one or more embodiments, the variable control signal TX_EN_B received at the control terminal of the second switch 108 may be between around 1.8 V and around 0 V, the voltage received at the input terminal of the second switch 108 from the buffer 104 when the first switch 106 is closed may be in a range of around −6.5 V to around −1 V or in a range of around −8 V to around 0 V, and the voltage coupled to the output terminal of the second switch 108 (i.e., the voltage VEE) may be around −8 V. Thus, the voltage difference between the input terminal and the output terminal of the second switch 108 can be as high as or higher than 8 V when the first switch 106 is closed and the second switch 108 is open, in accordance with one or more embodiments. Conventional metal oxide semiconductor (MOS) transistor devices typically have gate-source, gate-drain, and drain-source breakdown voltages (sometimes referred to herein as Vgs limits, Vgd limits, and Vds limits, respectively) that are respectively much lower than these values (e.g., such breakdown voltages may typically be around 2.5 V or around 3 V). In one or more embodiments, to prevent or mitigate damage to transistor devices of the second switch 108 due to over-voltage, the second switch 108 may include one or more cascode arrangements that are configured to limit the voltage drop across any two terminals of such transistor devices to be below corresponding breakdown voltage thresholds (sometimes referred to herein as "voltage limits") of those transistor devices, as described below.

Figure 2:
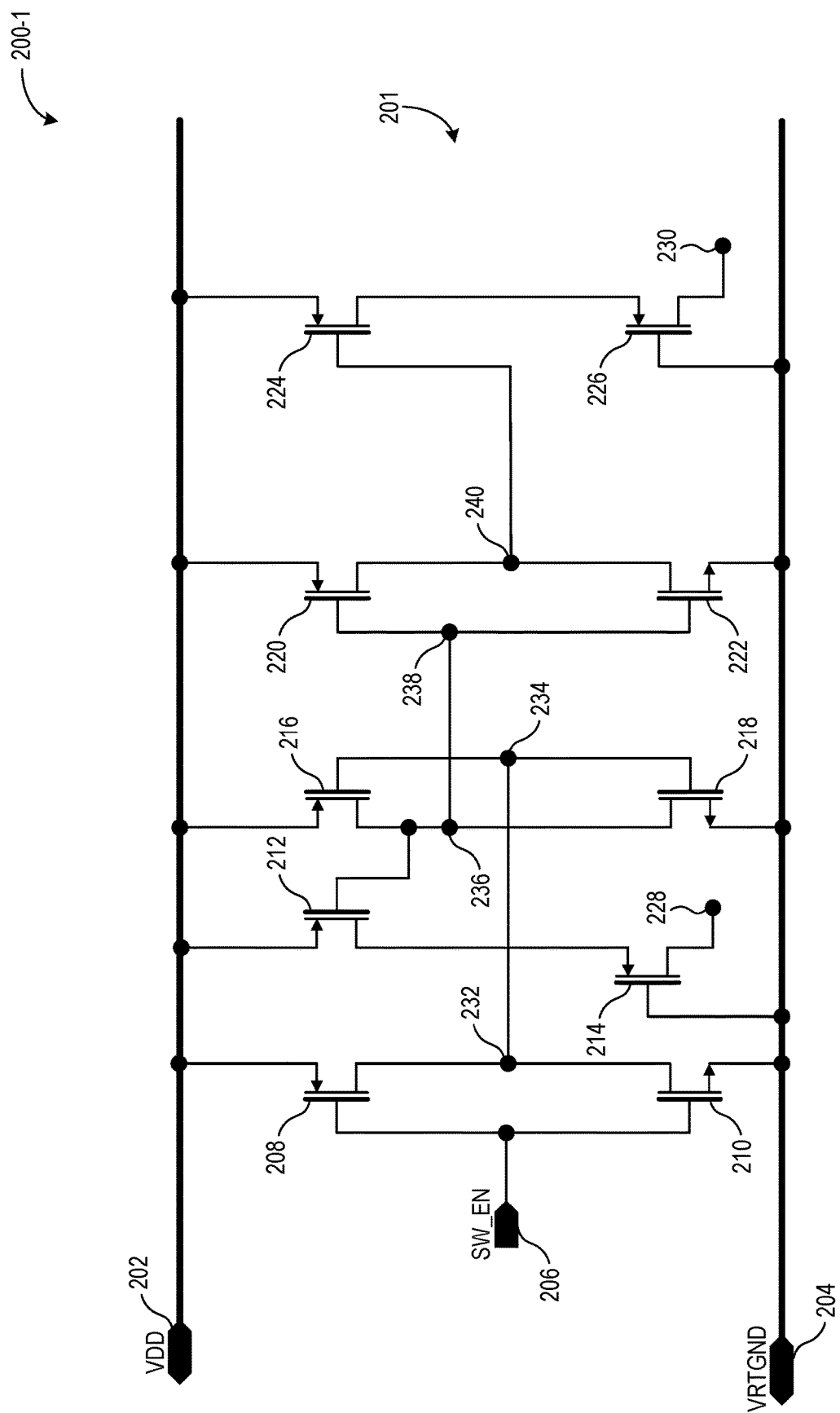
FIGS. 2 and 3 are block diagrams illustrating respective first and second portions of an example switching device, which may be included in the transistor gate control circuitry of FIG. 1, in accordance with various embodiments.
Figure 3:
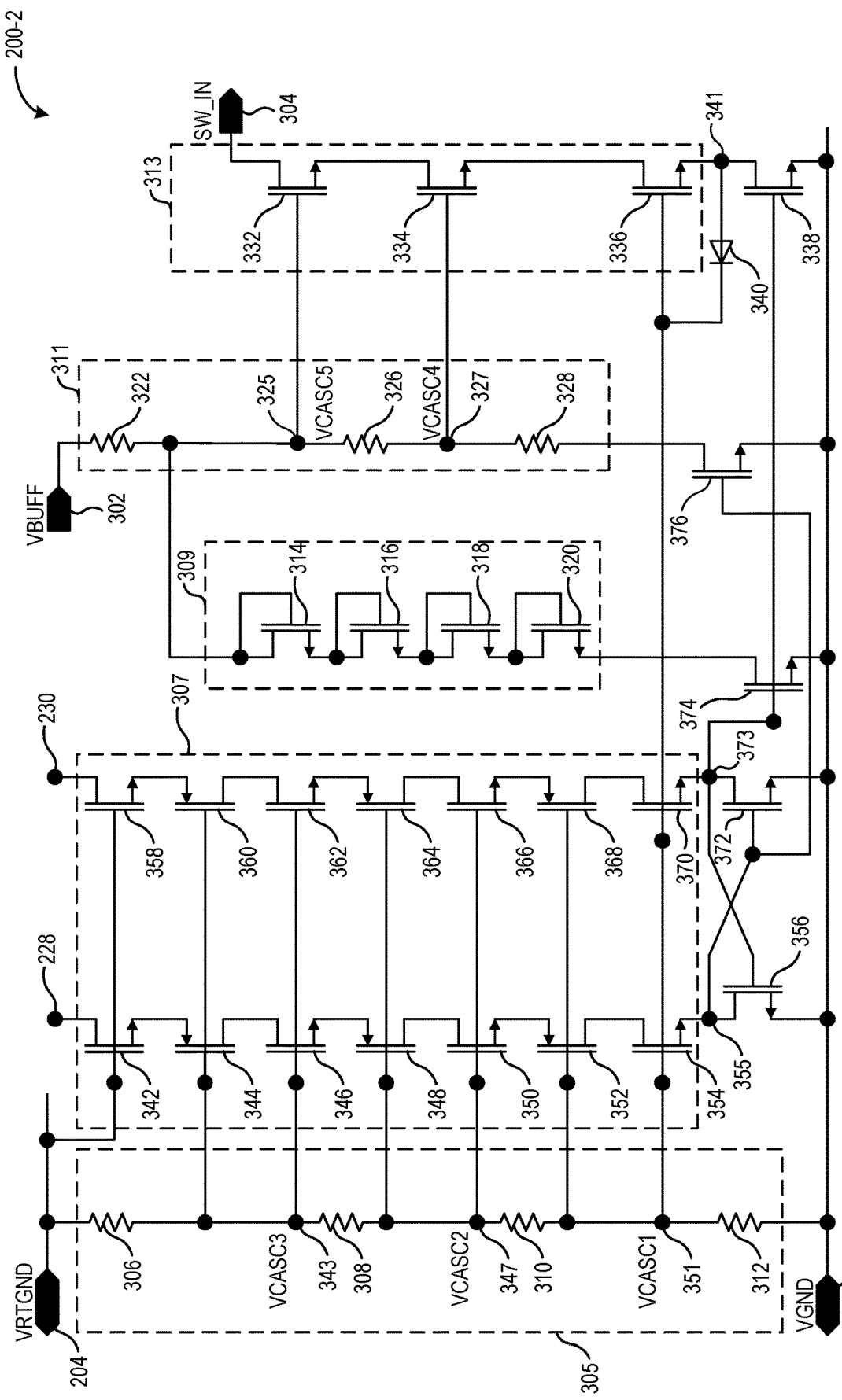

FIGS. 2 and 3 show block diagrams corresponding to respective first and second portions 200-1, 200-2 of a switching device 200 (sometimes referred to herein as the "switch 200") having an extended voltage range due, at least in part, to first and second cascode arrangements coupled between the input terminal and the output terminal (i.e., the first reference voltage supply 324 in the present example) of the switching device 200. In one or more embodiments, the switching device 200 may be implemented as the second switch 108 of the control circuitry 100 of FIG. 1.

Referring simultaneously to FIG. 2 and FIG. 3, the switching device 200 may include p-channel MOS (pMOS) transistors 208, 212, 214, 216, 220, 224, 226, 344, 348, 352, 360, 364, 368 n-channel MOS (nMOS) transistors 210, 218, 222, 314, 316, 318, 320, 332, 334, 336, 338, 342, 346, 350, 354, 356, 358, 362, 366, 370, 372, 374, 376, resistances 306, 308, 310, 312, 322, 326, 328, and a diode 340. Any of the resistances 306, 308, 310, 312, 326, 328 may be respectively implemented via a one or more resistors or electrically resistive elements in accordance with various embodiments. In one or more embodiments, the transistors 208, 210, 212, 214, 216, 218, 220, 222, 224, 226, 314, 316, 318, 320, 332, 334, 336, 338, 342, 344, 346, 348, 350, 352, 356, 358, 360, 362, 364, 366, 368, 370, 372, 374, 376 may each have Vgs, Vds, and Vgd voltage limits of around 3 V, such that inter-terminal voltages above around 3 V may stress or damage such transistors.

As will be described, the switching device 200 may be coupled to a positive voltage supply 202 configured to supply a positive voltage VDD (e.g., around 1.8 V), a first reference voltage supply 324 configured to provide a first reference voltage VGND (e.g., around −8 V), a second reference voltage supply 204 configured to provide a second reference voltage VRTGND (e.g., around 0 V), and a control signal source 206 (e.g., corresponding to the second control signal source 128 of FIG. 1 in one or more embodiments) configured to supply a control signal SW_EN (e.g., corresponding to the variable control signal TX_EN_B in one or more embodiments). In one or more embodiments, the first reference voltage VGND and the corresponding first reference voltage supply 324 may correspond to the negative voltage VEE and the corresponding negative voltage supply 124 of FIG. 1.

As shown in FIG. 2, the first portion 200-1 of the switching device 200 may include logic circuitry 201 configured to receive the control signal SW_EN via the control signal source 206. The logic circuitry 201 may include the pMOS transistors 208, 212, 214, 216, 220, 224, 226 and the nMOS transistors 210, 218, 222.

The pMOS transistor 208 may include a source terminal coupled to the positive voltage supply 202, a drain terminal coupled to a node 232, and a gate terminal coupled to the control signal source 206 and to the gate terminal of the nMOS transistor 210. Current flow between source and drain terminals of the pMOS transistor 212 may be controlled by the control signal SW_EN. The node 232 may be coupled to the node 234.

The pMOS transistor 212 may include a source terminal coupled to the positive voltage supply 202, a drain terminal coupled to the source terminal of the pMOS transistor 214, and a gate terminal coupled to a node 236. Current flow between source and drain terminals of the pMOS transistor 212 may be controlled by the voltage differential between VDD and the node 236.

The pMOS transistor 214 may include a source terminal coupled to drain terminal of the pMOS transistor 212, a drain terminal coupled to the node 228, and a gate terminal coupled to the second reference voltage supply 204. Current flow between source and drain terminals of the pMOS transistor 214 may be controlled by the voltage differential between VRTGND and the voltage at the drain terminal of the pMOS transistor 212.

The pMOS transistor 216 may include a source terminal coupled to the positive voltage supply 202, a drain terminal coupled to the node 236, and a gate terminal coupled to the node 234. The node 236 may be coupled to the node 238. Current flow between source and drain terminals of the pMOS transistor 216 may be controlled by the voltage differential between the node 234 and VDD.

The pMOS transistor 220 may include a source terminal coupled to the positive voltage supply 202, a drain terminal coupled to the node 240, and a gate terminal coupled to the node 238. Current flow between the source and drain terminals of the pMOS transistor 220 may be controlled by the voltage differential between the node 238 and VDD.

The pMOS transistor 224 may include a source terminal coupled to the positive voltage supply 202, a drain terminal coupled to the source terminal of the pMOS transistor 226, and a gate terminal coupled to the node 240. Current flow between the source and drain terminals of the pMOS transistor 220 may be controlled by the voltage differential between the node 240 and VDD.

The pMOS transistor 226 may include a source terminal coupled to the drain terminal of the pMOS transistor 224, a drain terminal coupled to the node 230, and a gate terminal coupled to the second reference voltage supply 204. Current flow between source and drain terminals of the pMOS transistor 226 may be controlled by the voltage differential between VRTGND and the voltage at the drain terminal of the pMOS transistor 224.

The nMOS transistor 210 may include a drain terminal coupled to the node 232, a source terminal coupled to the second reference voltage supply 204, and a gate terminal coupled to the control signal source 206. Current flow between source and drain terminals of the nMOS transistor 210 may be controlled by the control signal SW_EN.

The nMOS transistor 218 may include a drain terminal coupled to the node 236, a source terminal coupled to the second reference voltage supply 204, and a gate terminal coupled to the node 234. Current flow between source and drain terminals of the nMOS transistor 218 may be controlled by the voltage differential between the node 234 and VRTGND.

The nMOS transistor 222 may include a drain terminal coupled to the node 240, a source terminal coupled to the second reference voltage supply 204, and a gate terminal coupled to the node 238. Current flow between source and drain terminals of the nMOS transistor 222 may be controlled by the voltage differential between the node 238 and VRTGND.

As shown in FIG. 3, the second portion 200-2 of the switching device 200 may include a switch input terminal 304, a variable input terminal 302, the pMOS transistors 344, 348, 352, 360, 364, 368, the nMOS transistors 314, 316, 318, 320, 332, 334, 336, 338, 342, 346, 350, 354, 356, 358, 362, 366, 370, 372, 374, 376, the resistances 306, 308, 310, 312, 322, 326, 328, and the diode 340. The output terminal (e.g., the source terminal of the primary switching transistor 338) of the switching device 200 may be coupled to the first reference voltage supply 324. The voltage signal provided at the switch input terminal 304 is denoted as SW_IN (sometimes referred to herein as "the input voltage SW_IN") in the present example. In one or more embodiments, the input voltage SW_IN may be pulled to VGND or approximately VGND when the switch 200 is closed. In one or more embodiments, the input voltage SW_IN may be in a range of around −8 V to around −0 V when the switch 200 is off. In one or more embodiments, the input voltage SW_IN may correspond to the voltage at the node 132 of FIG. 1, such that the input voltage SW_IN corresponds to the voltage at the output of the buffer 104 of FIG. 1 when the switch 200 is off.

A first voltage divider 305 may be coupled between the first reference voltage supply 324 and the second reference voltage supply 204. The first voltage divider 305 may include a first set of series-connected resistances (sometimes referred to herein as "series resistances"), including the resistances 306, 308, 310, 312. The resistance 306 may include a first terminal coupled to the second reference voltage supply 204 and a second terminal coupled to a node 343 (sometimes referred to herein as the "third cascode bias control node 343"). The voltage at the node 343 corresponds to a third cascode bias voltage VCASC3.

The resistance 308 may include a first terminal coupled to the node 343 and a second terminal coupled to a node 347 (sometimes referred to herein as the "second cascode bias control node 347"). The voltage at the node 347 corresponds to a second cascode bias voltage VCASC2.

The resistance 310 may include a first terminal coupled to the node 347 and a second terminal coupled to the node 351 (sometimes referred to herein as the "first cascode bias control node 351"). The voltage at the node 351 corresponds to a first cascode bias voltage VCASC1.

The resistance 312 may include a first terminal coupled to the node 351 and a second terminal coupled to the first reference voltage supply 324. In one or more embodiments, the respective resistance values of the resistances 306, 308, 310, 312 may each be in a range of around 10 kΩ to around 100 kΩ. In one or more embodiments, the resistances 306, 308, 310, 312 may, with respect to one another, have the same or approximately the same resistance values.

A first cascode arrangement 307 may be coupled between the logic circuitry 201 of FIG. 2 and a pair of cross-coupled transistors, including the nMOS transistor 356 (sometimes referred to herein as the "first cross-coupled transistor 356") and the nMOS transistor 372 (sometimes referred to herein as the "second cross-coupled transistor 372"). The pair of cross-coupled transistors 356, 372 may be coupled between the first cascode arrangement 307 and the first reference voltage supply 324.

The first cascode arrangement 307 may include a first set of series-connected transistors (i.e., transistors coupled together in series source-to-drain) and a second set of series-connected transistors. The first set of series-connected transistors may be coupled between the logic circuitry 201 via the node 228 and the drain terminal of the first cross-coupled transistor 356. The second set of series-connected transistors may be coupled between the logic circuitry 201 via the node 230 and the drain terminal of the second cross-coupled transistor 372. The first cascode arrangement 307 and the first and second cross-coupled transistors 356, 372 may be collectively configured as a voltage level shifter. For example, the voltage level shifter may be configured to transition from the voltage domain of the logic circuitry 201 (e.g., around 0 V to around 1.8 V) to the voltage domain of the primary switching transistor 338 and/or the first reference voltage supply 324 (e.g., around −8 V).

The first set of series-connected transistors may include the nMOS transistors 342, 346, 350, 354 and the pMOS transistors 344, 348, 352. The nMOS transistor 342 may include a drain terminal coupled to the drain terminal of the pMOS transistor 214 via the node 228, a source terminal coupled to the source terminal of the pMOS transistor 344, and a gate terminal coupled to the second reference voltage supply 204. Current flow between the source and drain terminals of the nMOS transistor 342 may be controlled by the voltage differential between the source terminal of the nMOS transistor 342 and VRTGND.

The pMOS transistor 344 may include a source terminal coupled to the source terminal of the nMOS transistor 342, a drain terminal coupled to the drain terminal of the nMOS transistor 346, and a gate terminal coupled to the third cascode bias control node 343. Current flow between the source and drain terminals of the pMOS transistor 344 may be controlled by the voltage differential between the source terminal of the pMOS transistor 344 and VCASC3.

The nMOS transistor 346 may include a drain terminal coupled to the drain terminal of the pMOS transistor 344, a source terminal coupled to the source terminal of the pMOS transistor 348, and a gate terminal coupled to the third cascode bias control node 343. Current flow between the source and drain terminals of the nMOS transistor 346 may be controlled by the voltage differential between the source terminal of the nMOS transistor 346 and VCASC3.

The pMOS transistor 348 may include a source terminal coupled to the source terminal of the nMOS transistor 346, a drain terminal coupled to the drain terminal of the nMOS transistor 350, and a gate terminal coupled to the second cascode bias control node 347. Current flow between the source and drain terminals of the pMOS transistor 348 may be controlled by the voltage differential between the source terminal of the pMOS transistor 348 and VCASC2.

The nMOS transistor 350 may include a drain terminal coupled to the drain terminal of the pMOS transistor 348, a source terminal coupled to the source terminal of the pMOS transistor 352, and a gate terminal coupled to the second cascode bias control node 347. Current flow between the source and drain terminals of the nMOS transistor 350 may be controlled by the voltage differential between the source terminal of the nMOS transistor 350 and VCASC2.

The pMOS transistor 352 may include a source terminal coupled to the source terminal of the nMOS transistor 350, a drain terminal coupled to the drain terminal of the nMOS transistor 354, and a gate terminal coupled to the first cascode bias control node 351. Current flow between the source and drain terminals of the pMOS transistor 352 may be controlled by the voltage differential between the source terminal of the pMOS transistor 352 and VCASC1.

The nMOS transistor 354 may include a drain terminal coupled to the drain terminal of the pMOS transistor 352, a source terminal coupled to the source terminal of the first cross-coupled transistor 356 (i.e., via the node 355), and a gate terminal coupled to the first cascode bias control node 351. Current flow between the source and drain terminals of the nMOS transistor 354 may be controlled by the voltage differential between the node 355 and VCASC1.

The second set of series-connected transistors may include the nMOS transistors 358, 362, 366, 370 and the pMOS transistors 360, 364, 368. The nMOS transistor 358 may include a drain terminal coupled to the drain terminal of the pMOS transistor 226 via the node 230, a source terminal coupled to the source terminal of the pMOS transistor 360, and a gate terminal coupled to the second reference voltage supply 204. Current flow between the source and drain terminals of the nMOS transistor 358 may be controlled by the voltage differential between the source terminal of the nMOS transistor 358 and VRTGND.

The pMOS transistor 360 may include a source terminal coupled to the source terminal of the nMOS transistor 358, a drain terminal coupled to the drain terminal of the nMOS transistor 362, and a gate terminal coupled to the third cascode bias control node 343. Current flow between the source and drain terminals of the pMOS transistor 360 may be controlled by the voltage differential between the source terminal of the pMOS transistor 360 and VCASC3.

The nMOS transistor 362 may include a drain terminal coupled to the drain terminal of the pMOS transistor 360, a source terminal coupled to the source terminal of the pMOS transistor 364, and a gate terminal coupled to the third cascode bias control node 343. Current flow between the source and drain terminals of the nMOS transistor 362 may be controlled by the voltage differential between the source terminal of the nMOS transistor 362 and VCASC3.

The pMOS transistor 364 may include a source terminal coupled to the source terminal of the nMOS transistor 362, a drain terminal coupled to the drain terminal of the nMOS transistor 366, and a gate terminal coupled to the second cascode bias control node 347. Current flow between the source and drain terminals of the pMOS transistor 364 may be controlled by the voltage differential between the source terminal of the pMOS transistor 364 and VCASC2.

The nMOS transistor 366 may include a drain terminal coupled to the drain terminal of the pMOS transistor 364, a source terminal coupled to the source terminal of the pMOS transistor 368, and a gate terminal coupled to the second cascode bias control node 347. Current flow between the source and drain terminals of the nMOS transistor 366 may be controlled by the voltage differential between the source terminal of the nMOS transistor 366 and VCASC2.

The pMOS transistor 368 may include a source terminal coupled to the source terminal of the nMOS transistor 366, a drain terminal coupled to the drain terminal of the nMOS transistor 370, and a gate terminal coupled to the first cascode bias control node 351. Current flow between the source and drain terminals of the pMOS transistor 368 may be controlled by the voltage differential between the source terminal of the pMOS transistor 368 and VCASC1.

The nMOS transistor 370 may include a drain terminal coupled to the drain terminal of the pMOS transistor 368, a source terminal coupled to the source terminal of the second cross-coupled transistor 372 (i.e., via the node 373), and a gate terminal coupled to the first cascode bias control node 351. Current flow between the source and drain terminals of the nMOS transistor 370 may be controlled by the voltage differential between the node 373 and VCASC1.

The first cross-coupled transistor 356 may include a drain terminal coupled to the node 355 (i.e., to the gate terminal of the second cross-coupled transistor 372), a source terminal coupled to the first reference voltage supply 324, and a gate terminal coupled to the node 373 (i.e., to the drain terminal of the second cross-coupled transistor 372). Current flow through the source and drain terminals of the first cross-coupled transistor 356 may be controlled by the voltage differential between the node 373 and VGND.

The second cross-coupled transistor 372 may include a drain terminal coupled to the node 373 (i.e., to the gate terminal of the first cross-coupled transistor 356), a source terminal coupled to the first reference voltage supply 324, and a gate terminal coupled to the node 355 (i.e., to the drain terminal of the first cross-coupled transistor 356). Current flow through the source and drain terminals of the second cross-coupled transistor 372 may be controlled by the voltage differential between the node 355 and VGND. Here, the first and second cross-coupled transistors 356, 372 are considered to be "cross-coupled" at least because the gate terminal of each is coupled to the drain terminal of the other. The node 373 may be coupled to the respective gate terminals of the nMOS transistor 338 (sometimes referred to herein as the "primary switching transistor 338") and the nMOS transistor 374 (sometimes referred to herein as the "clamping transistor 374"), such that the primary switching transistor 338 and the clamping transistor 374 are selectively activated and deactivated based on the voltage at the node 373.

By controlling the respective voltages at the nodes 228, 230, the logic circuitry 201, in conjunction with the first cascode arrangement 307 and the cross-coupled transistors 356, 372, may control the voltages at the nodes 355, 373 based on the control signal SW_EN. By controlling the voltage at the node 373, the logic circuitry 201 may selectively control the state (e.g., closed or open) of the primary switching transistor 338.

A second voltage divider 311 may include a second set of series-connected resistances (sometimes referred to herein as "series resistances"), including the resistances 322, 326, 328, where the second set of series-connected resistances are coupled between the variable input terminal 302 and the first reference voltage supply 324. The second voltage divider 311 may be selectively coupled to the first reference voltage supply 324 via the nMOS transistor 376 (sometimes referred to herein as the "voltage divider enable transistor 376").

The variable input terminal 302 may be configured to provide a variable voltage VBUFF at the first terminal of the resistance 322. In one or more embodiments, the variable voltage VBUFF may be in a range of around 0 V to around −8 V. In one or more embodiments, the variable voltage VBUFF may be equal or approximately equal to the input voltage SW_IN when the switch 200 is off. In one or more embodiments, the variable voltage VBUFF may correspond to the output of a buffer (e.g., the buffer 104 of FIG. 1) that is also selectively coupled to the switch input terminal 304.

The resistance 322 may include a first terminal coupled to the variable input terminal 302 and a second terminal coupled to a node 325 (sometimes referred to herein as the "fifth cascode bias control node 325"). The voltage at the node 325 corresponds to a fifth cascode bias voltage VCASC5. The resistance 326 may include a first terminal coupled to the node 325 and a second terminal coupled to a node 327 (sometimes referred to herein as the "fourth cascode bias control node 327"). The voltage at the node 327 corresponds to a fourth cascode bias voltage VCASC4. The resistance 322 may include a first terminal coupled to the node 327 and a second terminal coupled to the drain terminal of the voltage divider enable transistor 376. In one or more embodiments, the respective resistance values of the resistances 322, 326, 328 may each be in a range of around 10 kΩ to around 100 kΩ.

The voltage divider enable transistor 376 may include a drain terminal coupled to the second terminal of the resistance 328 of the second voltage divider 311, a source terminal coupled to the first reference voltage supply 324, and a gate terminal coupled to the node 373. Current flow through the source and drain terminals of the voltage divider enable transistor 376 may be controlled by the voltage differential between the node 373 and VGND.

A second cascode arrangement 313 may include a third set of series-connected transistors, including the nMOS transistors 332, 334, 336. The third set of series-connected transistors may be coupled between the switch input terminal 304 and the drain terminal of the primary switching transistor 338 (i.e., the node 341). The primary switching transistor 338 may be configured to selectively connect the second cascode arrangement 313 to the first reference voltage supply 324.

The nMOS transistor 332 (sometimes referred to herein as the "first cascode transistor 332") may include a drain terminal coupled to the switch input terminal 304, a source terminal coupled to the drain terminal of the nMOS transistor 334, and a gate terminal coupled to the fifth cascode bias control node 325. Current flow through the source and drain terminals of the first cascode transistor 332 may be controlled by the voltage differential between the drain terminal of the nMOS transistor 334 and VCASC5.

The nMOS transistor 334 (sometimes referred to herein as the "second cascode transistor 334") may include a drain terminal coupled to the source terminal of the first cascode transistor 332, a source terminal coupled to the drain terminal of the nMOS transistor 336, and a gate terminal coupled to the fourth cascode bias control node 327. Current flow through the source and drain terminals of the second cascode transistor 334 may be controlled by the voltage differential between the drain terminal of the nMOS transistor 336 and VCASC4.

The nMOS transistor 336 (sometimes referred to herein as the "third cascode transistor 336") may include a drain terminal coupled to the source terminal of the second cascode transistor 334, a source terminal coupled to the drain terminal of the primary switching transistor 338, and a gate terminal coupled to the first cascode bias control node 351. Current flow through the source and drain terminals of the third cascode transistor 336 may be controlled by the voltage differential between the drain terminal of the primary switching transistor 338 and VCASC1. In one or more embodiments, a diode 340 may be coupled between the gate terminal of the third cascode transistor 336 and the source terminal of the third cascode transistor 336 (via the node 341).

The primary switching transistor 338 may include a drain terminal coupled to the source terminal of the third cascode transistor 336 (via the node 341), a source terminal coupled to the first reference voltage supply 324, and a gate terminal coupled to the node 373. Current flow through the source and drain terminals of the primary switching transistor 338 may be controlled by the voltage differential between the node 373 and VGND.

A fourth set of series-connected transistors 309 may include the nMOS transistors 314, 316, 318, 320. The fourth set of series-connected transistors may be coupled between the node 325 and the drain terminal of the clamping transistor 374, where the clamping transistor 374 may be configured to selectively couple the fourth set of series-connected transistors 309 to the first reference voltage supply 324. As described below, the clamping transistor 374 may be configured to connect the fourth set of series-connected transistors 309 to the first reference voltage supply when the primary switching transistor 338 is in a closed state, which may set the cascode bias voltages VCASC4 and VCASC5 of the to a fixed voltage (e.g., fixed relative to VGND).

The nMOS transistor 314 may include a drain terminal coupled to the node 325, a source terminal coupled to the drain terminal of the nMOS transistor 316, and a gate terminal coupled to its own drain terminal. Current flow through the source and drain terminals of the nMOS transistor 314 may be controlled by the voltage differential between the drain terminal of the nMOS transistor 316 and the drain terminal of the nMOS transistor 314.

The nMOS transistor 316 may include a drain terminal coupled to the source terminal of the nMOS transistor 314, a source terminal coupled to the drain terminal of the nMOS transistor 318, and a gate terminal coupled to its own drain terminal. Current flow through the source and drain terminals of the nMOS transistor 316 may be controlled by the voltage differential between the drain terminal of the nMOS transistor 318 and the drain terminal of the nMOS transistor 316.

The nMOS transistor 318 may include a drain terminal coupled to the source terminal of the nMOS transistor 316, a source terminal coupled to the drain terminal of the nMOS transistor 320, and a gate terminal coupled to its own drain terminal. Current flow through the source and drain terminals of the nMOS transistor 318 may be controlled by the voltage differential between the drain terminal of the nMOS transistor 320 and the drain terminal of the nMOS transistor 318.

The nMOS transistor 320 may include a drain terminal coupled to the source terminal of the nMOS transistor 318, a source terminal coupled to the drain terminal of the clamping transistor 374, and a gate terminal coupled to its own drain terminal. Current flow through the source and drain terminals of the nMOS transistor 320 may be controlled by the voltage differential between the drain terminal of the clamping transistor 374 and the drain terminal of the nMOS transistor 320.

The clamping transistor 374 may include a drain terminal coupled to the source terminal of the nMOS transistor 320, a source terminal coupled to the first reference voltage supply 324, and a gate terminal coupled to the node 373. Current flow through the source and drain terminals of the clamping transistor 374 may be controlled by the voltage differential the node 373 and VGND.

Referring simultaneously to both FIG. 2 and FIG. 3, the switch 200 may be turned on in response to assertion of the control signal SW_EN (e.g., setting SW_EN to VDD, which may be around 1.8 V). When the switch 200 is turned on, each of the primary switching transistor 338 and the first, second, and third cascode transistors 332, 334, 336 are closed, which may provide a low impedance path between the switch input terminal 304 and the first reference voltage supply 324, such that the input voltage SW_IN may be pulled down to the first reference voltage VGND (e.g., to around −8 V).

When the switch 200 is on, the control signal SW_EN (at around 1.8 V) causes the pMOS transistor 208 to be open and the nMOS transistor 210 to be closed, such that the nodes 232, 234 are at or around VRTGND (e.g., at or around 0 V). When the node 234 is at or around VRTGND, the pMOS transistor 216 is closed and the nMOS transistor 218 is open, such that the nodes 236, 238 are at around VDD (e.g., around 1.8 V).

When the node 236 is at or around VDD, the pMOS transistor 212 is open, such that the source terminal of the pMOS transistor 214 is not connected to the positive voltage supply 202 and is, therefore, open. This creates a high impedance between the node 228 and the positive voltage supply 202. When the node 238 is at around VDD, the pMOS transistor 220 is open and the nMOS transistor 222 is closed, such that the node 240 is at or around VRTGND. When the node 240 is at or around VRTGND, the pMOS transistor 224 is closed and causes voltage at the source terminal of the pMOS transistor 226 to be at or around VDD (i.e., by coupling the source terminal of the pMOS transistor 226 to the positive voltage supply 202). When the source terminal of the pMOS transistor 226 is at or around VDD, the pMOS transistor 226 is closed, and causes the node 230 to be at or around VDD (i.e., by coupling the node 230 to the positive voltage supply 202).

When the node 230 is at or around VDD, each of the transistors 358, 360, 362, 364, 366, 368, 370 may sustain a voltage drop between the node 230 and the node 373, such that the node 373 is set to a voltage sufficient to turn on (i.e., close) each of the first cross-coupled transistor 356, the clamping transistor 374, and the primary switching transistor 338. For example, when the node 230 is at or around VDD, the respective source voltages for each of the transistors 358, 360, 362, 364, 366, 368, may be set such that the respective Vgs values of the nMOS transistors 358, 362, 366 cause the nMOS transistors 358, 362, 366 to each be in a high impedance state with relatively high respective Vds values that do not exceed corresponding Vds voltage limits, and such that the respective Vgs values of the pMOS transistors 360, 364, 368 cause the pMOS transistors 360, 364, 368 to each be in a conducting state with relatively low respective Vds values. For example, when the voltage at the node 230 is at or around VDD, the voltage at the source terminals of the nMOS transistor 358 and the pMOS transistor 360 may be between VCASC3 and VRTGND, the voltage at the source terminals of the nMOS transistor 362 and the pMOS transistor 364 may be between VCASC2 and VCASC3, and the voltage at the source terminals of the nMOS transistor 366 and the pMOS transistor 368 may be between VCASC1 and VCASC2. Under these conditions, the node 373 may be pulled to a voltage sufficient to cause the switch 200 to be in the closed state (i.e., by causing the primary switching transistor 338 to be in the closed state).

For example, when the first cross-coupled transistor 356 is closed, the node 355 is coupled to the first reference voltage supply 324 such that the voltage at the node 355 is at or around VGND (e.g., around −8 V). When the voltage at the node 355 is at or around VGND, the second cross-coupled transistor 372 is open, thereby isolating the node 373 from VGND.

The first, second, and third cascode bias voltages VCASC1, VCASC2, VCASC3 may be at respective fixed voltage levels (based on resistance values of the resistances 306, 308, 310, 312 of the first voltage divider 305). For example, the first, second, and third cascode bias voltages VCASC1, VCASC2, and VCASC3 may be fixed voltages, each between VRTGND and VGND. In one or more embodiments, VRTGND (e.g., around 0 V) may be around 8 V above VGND (e.g., around −8 V), VCASC1 may be around 2 V above VGND (e.g., around −6 V), VCASC2 may be around 4 V above VGND (e.g., around −4 V), and VCASC3 may be around 6 V above VGND (e.g., around −2 V). The first, second, and third cascode bias voltages VCASC1, VCASC2, VCASC3 may have respective voltage values sufficient to prevent Vgs limits of any of the transistors 358, 360, 362, 364, 366, 368, 370, 372 from being exceeded when the switch 200 is on.

The cascode bias voltages VCASC4 and VCASC5 may be dynamic voltages, the respective values of which may change depending on the state of the switch 200. When the switch 200 is in a closed state, the clamping transistor 374 is closed and the voltage divider enable transistor 376 is open, such that the cascode bias voltages VCASC4 and VCASC5 may each be clamped to a fixed voltage of around 2.5 V above VGND. For example, the cascode bias voltages VCASC4 and VCASC5 may be expected to be the same or around same in such conditions, at least because little or no current is expected to flow through the resistance 326. For example, the clamping transistor 374, when closed, causes the nMOS transistors 314, 316, 318, 320 to close, such that the node 325 is coupled to the first reference voltage supply 324.

Assuming the voltage drop (e.g., corresponding, in this case, to Vgs) across each of the transistors 314, 316, 318, 320, is around 0.4 V when closed and the voltage drop across the transistor 374 is around 0.1 V when closed, this causes the voltage VCASC5 at the node 325 to be at or around VGND+2.5 V (e.g., around −5.5 V). When the clamping transistor 374 is closed, the voltage divider enable transistor 376 is open (e.g., due to the voltage at the node 355 being at or around VGND), creating an open circuit at the second terminal of the resistance 328 of the second voltage divider 311, such that the voltage VCASC4 at the node 327 is around the same as the voltage VCASC5 at the node 325 (e.g., around −5.5 V). By setting the values of VCASC4 and VCASC5 to around 2.5 V above VGND in this way, when the switch 200 is on and the source and drain terminals of the first and second cascode transistors 332, 334 are at around VGND, the Vgs and Vgd values for the first and second cascode transistors 332, 334 may be around 2.5 V, which is less than the Vgs and Vgd limits (e.g., around 3 V) of the first and second cascode transistors 332, 334.

In one or more embodiments, when the switch 200 is closed, the first cascode bias voltage VCASC1 may remain at a fixed voltage of around 2 V above VGND (e.g., around −6 V), which may be sufficient to close the third cascode transistor 336 when the primary switching transistor 338 is closed, while keeping Vgs and Vgd of the third cascode transistor 336 at around 2 V, which is below the corresponding Vgs and Vgd voltage limits of around 3 V.

The switch 200 may be turned off in response to deassertion of the control signal SW_EN (e.g., setting SW_EN to VRTGND, which may be around 0 V). When the switch 200 is turned off, each of the primary switching transistor 338 and the first, second, and third cascode transistors 332, 334, 336 are open, which may prevent current flow between the switch input terminal 304 and the first reference voltage supply 324, such that the switch input terminal 304 may be electrically isolated from the first reference voltage supply 324.

When the switch 200 is off, the control signal SW_EN (at around 0 V) causes the pMOS transistor 208 to be closed and the nMOS transistor 210 to be open, such that the nodes 232, 234 are at or around VDD (e.g., at or around 1.8 V). When the node 234 is at or around VDD, the pMOS transistor 216 is open and the nMOS transistor 218 is closed, such that the nodes 236, 238 are at around VRTGND (e.g., around 0 V).

When the node 236 is at or around VRTGND, the pMOS transistor 212 is closed, such that the source terminal of the pMOS transistor 214 is coupled to the positive voltage supply 202 and is, therefore, closed. This causes the voltage at the node 228 to be at or around VDD. When the node 238 is at around VRTGND, the pMOS transistor 220 is closed and the nMOS transistor 222 is open, such that the node 240 is at or around VDD. When the node 240 is at or around VDD, the pMOS transistor 224 is open and creates an open circuit at the source terminal of the pMOS transistor 226. When the source terminal of the pMOS transistor 226 corresponds to an open circuit, the pMOS transistor 226 is open, and creates a high impedance between the node 230 and the positive voltage supply 202.

When the node 228 is at or around VDD, each of the transistors 342, 344, 346, 348, 350, 352, 354 may sustain a voltage drop between the node 228 and the node 355, such that the node 355 is set to a voltage sufficient to turn on (i.e., close) each of the second cross-coupled transistor 372 and the voltage divider enable transistor 376. For example, when the node 228 is at or around VDD, the respective source voltages for each of the transistors 342, 344, 346, 348, 350, 352 may be set such that the respective Vgs values of the nMOS transistors 342, 346, 350 cause the nMOS transistors 342, 346, 350 to each be in a high impedance state with relatively high respective Vds values that do not exceed corresponding Vds voltage limits, and such that the respective Vgs values of the pMOS transistors 344, 348, 352 cause the pMOS transistors 344, 348, 352 to each be in a conducting state with relatively low respective Vds values. For example, when the voltage at the node 228 is at or around VDD, the voltage at the source terminals of the nMOS transistor 342 and the pMOS transistor 344 may be between VCASC3 and VRTGND, the voltage at the source terminals of the nMOS transistor 346 and the pMOS transistor 348 may be between VCASC2 and VCASC3, the voltage at the source terminals of the nMOS transistor 350 and the pMOS transistor 352 may be between VCASC1 and VCASC2. Under these conditions, the node 355 may be pulled to a voltage sufficient to turn on the second cross-coupled transistor 372, thereby pulling the node 373 to be at or around VGND and causing the switch 200 to be in the open state by causing the primary switching transistor 338 to be in the open state.

For example, when the second cross-coupled transistor 372 is closed, the node 373 is coupled to the first reference voltage supply 324 such that the voltage at the node 373 is at or around VGND (e.g., around −8 V). When the voltage at the node 373 is at or around VGND, the first cross-coupled transistor 356 is open, thereby isolating the node 355 from VGND, and each of the clamping transistor 374 and the primary switching transistor 338 are open. When the primary switching transistor 338 is open, the source terminals of the first, second, and third cascode transistors 332, 334, 336 are effectively open circuits, such that the switch input terminal 304 is electrically isolated from the first reference voltage supply 324.

The first, second, and third cascode bias voltages VCASC1, VCASC2, VCASC3 may be at respective fixed voltage levels (based on resistance values of the resistances 306, 308, 310, 312 of the first voltage divider 305), as described above. The first, second, and third cascode bias voltages VCASC1, VCASC2, VCASC3 may have respective voltage values sufficient to prevent Vgs limits of any of the transistors 342, 344, 346, 348, 350, 352, 354 from being exceeded when the switch 200 is off.

The cascode bias voltages VCASC4 and VCASC5 may be dynamic voltages, the respective values of which may change depending on the state of the switch 200. When the switch 200 is in an open state, the clamping transistor 374 is open and the voltage divider enable transistor 376 is closed. When clamping transistor 374 is open, it causes the nMOS transistors 314, 316, 318, 320 to be open, such that the node 325 is not coupled to the first reference voltage supply 324 through the nMOS transistors 314, 316, 318, 320. When the voltage divider enable transistor 376 is closed, current flows through the second voltage divider 311, such that the cascode bias voltages VCASC4 and VCASC5 are each be between the variable voltage VBUFF and the first reference voltage VGND. For example, given a variable voltage VBUFF of −2 V and VGND of −8 V the voltage VCASC5 at the node 325 may be at or around −4 V and VCASC4 may be at or around −6 V.

Closing the voltage divider enable transistor 376 when the switch 200 is in the open state causes the resistances 325, 328 and nodes 325, 327 to be coupled between VBUFF and VGND, such that the values of VCASC4 and VCASC5 are set based on the resistance values of the resistances 322, 326, 328 of the voltage divider 311. The clamping transistor 374 may be open while the voltage divider enable transistor 376 is closed, such that a low impedance path between the fourth set of series-connected transistors 308 and VGND is not provided through the clamping transistor 374 while the switch 200 is in the open state. In this way, the Vgs and Vgd values of the first and second cascode transistors 332, 334 may be maintained at less than their corresponding Vgs and Vgd limits (e.g., around 3 V). For example, the second voltage divider may be configured such that the values of VCASC4 and VCASC5 change to accommodate changes to the value of the variable voltage VBUFF and the switch input SW_IN (where SW_IN may be the equal to or approximately equal to VBUFF when the switch 200 is open, in one or more embodiments). When the switch 200 is open, the first cascode bias voltage VCASC1 may remain at a fixed voltage of around 2 V above VGND (e.g., around −6 V), which may be sufficient to keep the Vgs limit of the third cascode transistor 336 from being exceeded. For example, when the switch 200 is in the open state, the voltage at the source of the first cascode transistor 332 may be less than or equal to VCASC5, the voltage at the source of the second cascode transistor 332 may be less than or equal to VCASC4, and the voltage at the source of the third cascode transistor 336 may be less than or equal to VCASC1.

In this way, the second cascode arrangement 313 in conjunction with the second voltage divider 311 may prevent the inter-terminal voltage limits of the first, second, and third cascode transistors 332, 334, 336 and the primary switching transistor 338 from being exceeded while the switch 200 is open, even given changes in the values of VBUFF and SW_IN (e.g., in a range of around −8 V to around 0 V). Preventing the inter-terminal voltage limits of the first, second, and third cascode transistors 332, 334, 336 and the primary switching transistor 338 in this way may advantageously increase the operating voltage range of the switch 200.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in one or more embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A switch comprising:
a first input terminal;
a second input terminal;
logic circuitry configured to receive a control signal;
a first voltage divider that includes a first plurality of series resistances, wherein the first voltage divider is electrically coupled between first reference voltage supply and a second reference voltage supply;
a second voltage divider that includes a second plurality of series resistances, wherein the second voltage divider is electrically coupled between the second input terminal and the first reference voltage supply;
a first cascode arrangement electrically coupled to the logic circuitry and comprising at least one set of series-connected transistors having control terminals electrically coupled to nodes of the first voltage divider;
a primary switching transistor that includes a first current-carrying terminal, a second current-carrying terminal electrically coupled to the first current-carrying terminal and electrically coupled to the first reference voltage supply, and a first control terminal configured to control the flow of current from the first current-carrying terminal to the second current-carrying terminal, wherein the first control terminal is electrically coupled to the first cascode arrangement, and the logic circuitry is configured to control a state of the primary switching transistor based on the control signal; and
a second cascode arrangement comprising:
a first cascode transistor that includes a third current-carrying terminal electrically coupled to the input terminal, a fourth current-carrying terminal electrically coupled to the third current-carrying terminal, and a second control terminal configured to control the flow of current from the third current-carrying terminal to the fourth current-carrying terminal, wherein the second control terminal is electrically coupled to the second voltage divider;
a second cascode transistor that includes a fifth current-carrying terminal electrically coupled to the fourth current-carrying terminal of the first cascode transistor, a sixth current-carrying terminal electrically coupled to the fifth current-carrying terminal, and a third control terminal configured to control the flow of current from the fifth current-carrying terminal to the sixth current-carrying terminal, wherein the third control terminal is electrically coupled to the second voltage divider; and
a third cascode transistor that includes a seventh current-carrying terminal electrically coupled to the sixth current-carrying terminal of the second cascode transistor, an eighth current-carrying terminal electrically coupled to the seventh current-carrying terminal, and a fourth control terminal configured to control the flow of current from the seventh current-carrying terminal to the eighth current-carrying terminal, wherein the fourth control terminal is electrically coupled to the first voltage divider.

2. The switch of claim 1, further comprising:
a pair of cross-coupled transistors electrically coupled between the first cascode arrangement and the first reference voltage supply, the pair of cross-coupled transistors comprising:

a first cross-coupled transistor having a ninth current-carrying terminal electrically coupled to the first cascode arrangement, a tenth current-carrying terminal electrically coupled to the ninth current-carrying terminal and to the first reference voltage supply, and a fifth control terminal configured to control the flow of current from the ninth current-carrying terminal to the tenth current-carrying terminal; and a second cross-coupled transistor having an eleventh current-carrying terminal electrically coupled to the first cascode arrangement, a twelfth current-carrying terminal electrically coupled to the eleventh current-carrying terminal and to the first reference voltage supply, and a sixth control terminal configured to control the flow of current from the eleventh current-carrying terminal to the twelfth current-carrying terminal, wherein the sixth control terminal is electrically coupled to the ninth current-carrying terminal, and the eleventh current-carrying terminal is electrically coupled to the fifth control terminal and the first control terminal.

3. The switch of claim 2, further comprising:
a voltage divider enable transistor having a thirteenth current-carrying terminal electrically coupled to second voltage divider, a fourteenth current-carrying terminal electrically coupled to the thirteenth current-carrying terminal and to the first reference voltage supply, and a seventh control terminal configured to control the flow of current from the thirteenth current-carrying terminal to the fourteenth current-carrying terminal, wherein the seventh control terminal is electrically coupled to the ninth current-carrying terminal of the first cross-coupled transistor.

4. The switch of claim 3, further comprising:
a plurality of series-connected transistors electrically coupled between the second voltage divider and the first reference voltage supply, each of the plurality of series-connected transistors having a respective control terminal and a respective current-carrying terminal electrically coupled to its respective control terminal; and
a clamping transistor having a fifteenth current-carrying terminal electrically coupled to the plurality of series-connected transistors, a sixteenth current-carrying terminal electrically coupled to the fifteenth current-carrying terminal and to the first reference voltage supply, and a eighth control terminal configured to control the flow of current from the fifteenth current-carrying terminal to the sixteenth current-carrying terminal, wherein the eighth control terminal is electrically coupled to the eleventh current-carrying terminal of the second cross-coupled transistor.

5. The switch of claim 4, wherein the second input terminal is configured to receive a variable voltage, and voltages at nodes of the second voltage divider are dependent on the variable voltage when the primary switching transistor is in an open state.

6. The switch of claim 5, wherein the clamping transistor and the plurality of series-connected transistors are configured to set the voltages at the nodes of the second voltage divider to a fixed voltage when the primary switching transistor is in a closed state.

7. The switch of claim 5, wherein the fourth control terminal of the third cascode transistor is configured to receive a fixed voltage from the first voltage divider.

8. The switch of claim 1, wherein the logic circuitry is electrically coupled between a positive voltage supply that is configured to output a positive voltage, wherein the first reference voltage supply is configured to output a first reference voltage that is at least 8 V lower than the positive voltage.

9. A switching device comprising:
a first input terminal;
a second input terminal
a first voltage divider electrically coupled between a first reference voltage supply configured to provide a first reference voltage and a second reference voltage supply configured to provide a second reference voltage;
logic circuitry coupled to the second reference voltage supply and configured to receive a control signal;
a voltage level shifter coupled between the logic circuitry and the first reference voltage supply;
a primary switching transistor having a first source terminal electrically coupled to the first reference voltage supply, a first drain terminal, and a first gate terminal electrically coupled to the voltage level shifter;
a cascode arrangement electrically coupled between the first drain terminal of the primary switching transistor and the first input terminal, wherein the cascode arrangement is configured to prevent a drain-source voltage of the primary switching transistor from exceeding a drain-source voltage limit of the primary switching transistor when the switching device is closed;
a second voltage divider coupled to the second input terminal, wherein each of the first voltage divider and the second voltage divider is configured to provide at least one cascode bias voltage to the cascode arrangement,
a plurality of series-connected transistors electrically coupled between a first node of the second voltage divider the first reference voltage supply, each of the plurality of series-connected transistors having a respective gate terminal and a respective drain terminal electrically coupled to its respective gate terminal; and
a clamping transistor having a second drain terminal electrically coupled to the plurality of series-connected transistors, a second source terminal electrically coupled to the first reference voltage supply, and a second gate terminal electrically coupled to a first node of the voltage level shifter.

10. The switching device of claim 9, wherein the cascode arrangement comprises:
a first cascode transistor having a third drain terminal electrically coupled to the first input terminal, a third source terminal, and a third gate terminal electrically coupled to the first node of the second voltage divider;
a second cascode transistor having a fourth drain terminal electrically coupled to the third source terminal of the first cascode transistor, a fourth source terminal, and a fourth gate terminal electrically coupled to a second node of the second voltage divider; and
a third cascode transistor that includes a fifth drain terminal electrically coupled to the fourth source terminal of the second cascode transistor, a fifth source terminal electrically coupled to the first drain terminal of the primary switching transistor, and a fifth gate terminal electrically coupled to a node of the first voltage divider.

11. The switching device of claim 10, further comprising:
a voltage divider enable transistor having a sixth drain terminal electrically coupled to the second voltage divider, a sixth source terminal electrically coupled to the first reference voltage supply, and a sixth gate terminal electrically coupled to a second node of the voltage level shifter.

12. The switching device of claim 11, wherein the second input terminal is configured to receive a variable voltage, and bias voltages at the first node and the second node of the second voltage divider are dependent on the variable voltage when the primary switching transistor is in an open state.

13. The switching device of claim 12, wherein the clamping transistor and the plurality of series-connected transistors are configured to set the bias voltages at the first node and the second node of the second voltage divider to a fixed voltage when the primary switching transistor is in a closed state.

14. The switching device of claim 13, wherein the node of the first voltage divider is configured to provide a fixed bias voltage to the fifth gate terminal of the third cascode transistor.

15. The switching device of claim 11, wherein the voltage level shifter comprises:
an additional cascode arrangement electrically coupled to the logic circuitry and to the first voltage divider; and
a pair of cross-coupled transistors electrically coupled between the additional cascode arrangement and the first reference voltage supply, wherein the first node of the voltage level shifter corresponds to a seventh drain terminal of the pair of cross-coupled transistors and the second node of the voltage level shifter corresponds to an eighth drain terminal of the pair of cross-coupled transistors.

16. The switching device of claim 15, wherein the additional cascode arrangement comprises:
a first set of series-coupled transistors electrically coupled between the logic circuitry and the seventh drain terminal of the pair of cross-coupled transistors and having a first plurality of gate terminals electrically coupled to the first voltage divider; and
a second set of series-coupled transistors electrically coupled between the logic circuitry and the eighth drain terminal of the pair of cross-coupled transistors and having a second plurality of gate terminals electrically coupled to the first voltage divider.

17. The switching device of claim 9, wherein the logic circuitry and the voltage level shifter are configured to control a state of the primary switching transistor based on the control signal.

18. The switching device of claim 10, wherein the first reference voltage is at least 8 V lower than the second reference voltage.

19. Control circuitry comprising:
an amplifier transistor configured to receive an RF input signal for amplification;
a reference transistor, wherein the amplifier transistor and the reference transistor are formed on the same semiconductor die;
a unity gain buffer having a non-inverting input electrically coupled to the reference transistor, an output electrically coupled to a control terminal of the amplifier transistor, and an inverting input electrically coupled to the output of the unity gain buffer; and
a switch comprising:
a first input terminal;
a second input terminal;
a first voltage divider electrically coupled between a first reference voltage supply configured to provide a first reference voltage and a second reference voltage supply configured to provide a second reference voltage;
logic circuitry coupled to the second reference voltage supply and configured to receive a control signal;
a voltage level shifter coupled between the logic circuitry and the first reference voltage supply;
a primary switching transistor having a first source terminal electrically coupled to the first reference voltage supply, a first drain terminal, and a first gate terminal electrically coupled to the voltage level shifter;
a cascode arrangement electrically coupled between the first drain terminal of the primary switching transistor and the first input terminal, wherein the cascode arrangement is configured to prevent a drain-source voltage of the primary switching transistor from exceeding a drain-source voltage limit of the primary switching transistor when the switch is closed;
a second voltage divider coupled to the second input terminal, wherein each of the first voltage divider and the second voltage divider is configured to provide at least one cascode bias voltage to the cascode arrangement;
a plurality of series-connected transistors electrically coupled between a first node of the second voltage divider and the first reference voltage supply, each of the plurality of series-connected transistors having a respective gate terminal and a respective drain terminal electrically coupled to its respective gate terminal; and
a clamping transistor having a second drain terminal electrically coupled to the plurality of series-connected transistors, a second source terminal electrically coupled to the first reference voltage supply, and a second gate terminal electrically coupled to a first mode of the voltage level shifter.

* * * * *